United States Patent [19]

Shiga

[11] Patent Number: 5,172,074
[45] Date of Patent: Dec. 15, 1992

[54] LOW NOISE MULTI-STAGE TYPE AMPLIFIER

[75] Inventor: Nobuo Shiga, Yokohama, Japan

[73] Assignee: Sumitomo Electric Industries, Inc., Osaka, Japan

[21] Appl. No.: 704,264

[22] Filed: May 22, 1991

[30] Foreign Application Priority Data

May 25, 1990 [JP] Japan .................................. 2-136835
May 25, 1990 [JP] Japan .................................. 2-136836

[51] Int. Cl.⁵ ............................................ H03F 3/16
[52] U.S. Cl. ................................... 330/277; 330/286
[58] Field of Search .............. 330/277, 286, 297, 296

[56] References Cited

U.S. PATENT DOCUMENTS

| | | | |
|---|---|---|---|
| 4,623,848 | 11/1986 | Saka et al. | 330/277 |
| 4,631,495 | 12/1986 | Mueller et al. | 330/295 |
| 5,010,588 | 4/1991 | Gimlett | 330/308 |

FOREIGN PATENT DOCUMENTS 61-1104A  1/1986  Japan .................................. 330/277

OTHER PUBLICATIONS

A 12 GHz 140K Low Noise GaAs FET Amplifier, by Fujiki et al.

Microwave Field-Effect Transistors, IEEE, Jun. 1976 by Liechti.

Lehmann et al., "X-Band Monolithic Series Feedback LNA", IEEE Transactions on Microwave Theory and Techniques, vol. MTT-33, No. 12, pp. 1560–1566, Dec. 1985.

Albinsson, "A Graphic Design Method for Matched Low-Noise Amplifiers", IEEE Transactions on Microwave Theory and Techniques, vol. 38, No. 2, pp. 118–122, Feb. 1990.

Heston, et al., "Monolithic Breadboard: Key to Radical MMIC Size Reduction", Microwave Journal, vol. 33, No. 4, pp. 283–286, Apr. 1990.

*Primary Examiner*—Eugene R. LaRoche
*Assistant Examiner*—Tan Dinh
*Attorney, Agent, or Firm*—Stevens, Davis, Miller & Mosher

[57] ABSTRACT

In a low-noise multistage amplifier of this invention, operation currents of amplifiers in respective stages (in particular, first- and final-stage amplifiers) are set so that an optimal signal source reflection coefficient $\Gamma_{opt}$ and S parameters are almost not varied by manufacturing variations. The lengths of source stubs connected to FETs of the amplifiers in the respective stages are optimally set in units of stages so that characteristics of the amplifier do not change due to the manufacturing variations, and a sufficient gain can be obtained.

4 Claims, 10 Drawing Sheets

LOW NOISE MULTI-STAGE TYPE AMPLIFIER

BACKGROUND OF THE INVENTION

1. Field of the Invention

The present invention relates to a low noise multistage type amplifier used in, e.g., a direct satellite (DBS) system.

2. Related Background Art

The NF (noise factor) of a multistage amplifier constituted by a plurality of FETs (field effect transistors) is changed depending on a drain current flowing through a drain-source path of each FET. For this reason, the operation current of each FET is set to have a drain current value for minimizing the NF.

However, since FETs suffer from manufacturing variations, threshold value voltages of FETs also vary, and as a result, operation current values vary accordingly. Therefore, even when the operation current value of the multistage amplifier is set to be a value for minimizing the NF like in the conventional amplifier, the NF cannot be stabilized due to a variation in operation current value caused by manufacturing variations of FETs, and the characteristics of the amplifier become unstable.

As a conventional multistage amplifier of this type, for example, an amplifier described in "X-Band Monolithic Series Feedback LNA", IEEE TRANSACTIONS ON MICROWAVE THEORY AND TECHNIQUES, VOL. MTI-33, NO. 12, Dec. 1985 is known. This reference discloses a multistage amplifier having a three-stage structure using FETs each having a gate length of 0.5 $\mu$m, and a gate width of 300 $\mu$m.

However, in the conventional multistage amplifier, a stub to be added to the source of an FET in each stage, and an inter-stage matching network are not optimally designed. More specifically, the characteristics of the amplifier are changed due to manufacturing variations of FETs, resulting in poor I/O impedance matching of the amplifier.

SUMMARY OF THE INVENTION

The present invention has been made to solve the conventional problems of a low-noise multistage amplifier.

It is the first object of the present invention to provide a low-noise multistage amplifier which has a stable NF against manufacturing variations.

In order to achieve the above object, in a low-noise multistage amplifier according to the present invention, operation current values of first- and final-stage amplifiers are set to be values which can eliminate an influence of a change in drain current on an optimal signal source reflection coefficient $\Gamma_{opt}$ and S parameters.

With this arrangement, even when a drain current is changed due to manufacturing variations of FETs, the optimal source reflection coefficient $\Gamma_{opt}$ and the S parameters of the first- and final-stage amplifiers which determine I/O characteristics and an NF are almost not varied.

It is the second object of the present invention to provide a low-noise multistage amplifier whose I/O characteristics are not changed against manufacturing variations.

In order to achieve the above object, in a low-noise multistage amplifier of the present invention, microstrip lines, each of which is long enough to yield a stabilization index K of not less than 1 and is referred to as source stubs hereinafter are connected to source-ground paths of the FETs used in the amplifiers of the respective stages, the source stubs of the first- and final-stage amplifiers are longer than the source stubs of intermediate-stage amplifiers, an input matching network connected to the first-stage amplifier minimizes a noise factor, an inter-stage matching network between the intermediate-stage amplifier in the second stage and the first-stage amplifier causes an optimal source reflection coefficient $\Gamma_{opt}$ and a complex conjugate $S_{11}^*$ of a parameter $S_{11}$ of the FET in the first stage to coincide with each other, and inter-stage matching networks connected to the amplifiers after the intermediate-stage amplifier in the second stage, and an output matching network connected to the final-stage amplifier maximize a gain.

With this arrangement, since sufficiently long stubs are connected to the sources of FETs in a first-stage amplifier which has a large influence on an NF of the overall amplifier, and determines an input impedance, and in a final-stage amplifier which determines an output impedance, a feedback amount can be increased, and I/O characteristics of the amplifier are less influenced by manufacturing variations of FETs. Since the length of a stub to be connected to an FET of an inter-stage matching network is set to be rather shorter, it is advantageous to increase a gain of the entire circuit.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art form this detailed description.

DESCRIPTION OF THE PREFERRED EMBODIMENT

A multistage amplifier according to an embodiment of the present invention will be described below.

Figure 1:
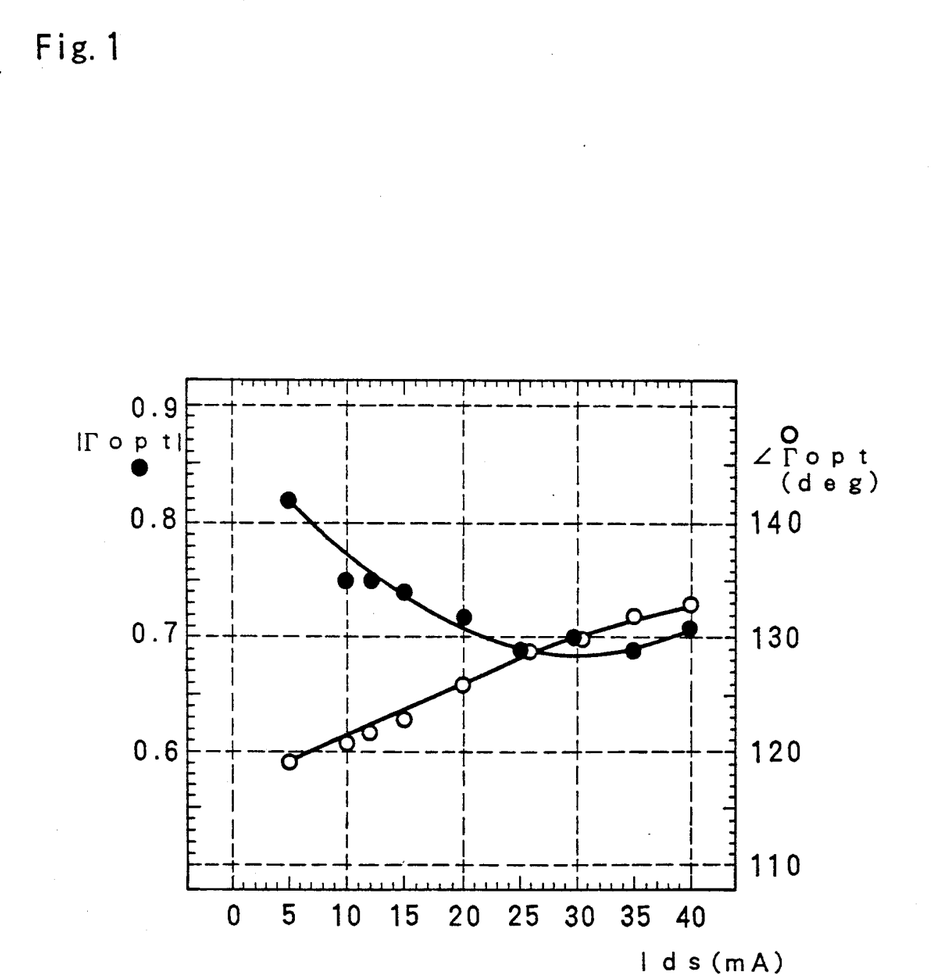
FIG. 1 is a graph showing the relationship between a drain current $I_{ds}$ and $\Gamma_{opt}$ of a pulse doped structure FET.
Figure 2:
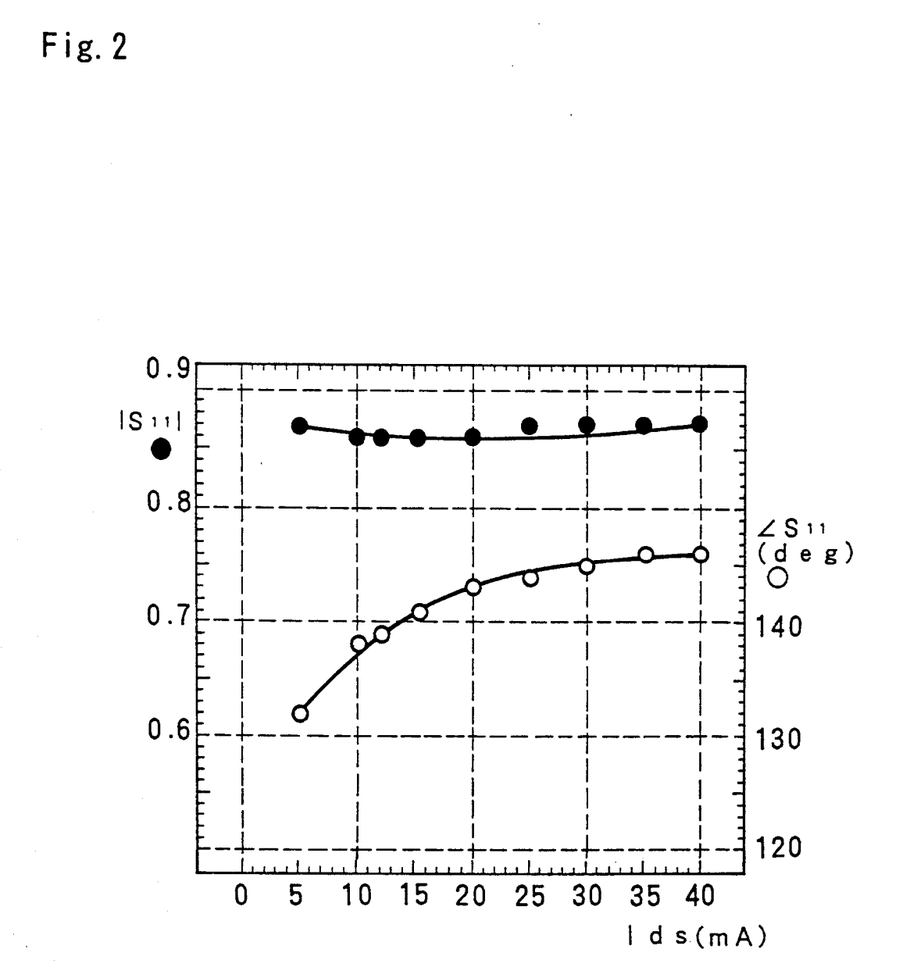
FIG. 2 is a graph showing the relationship between the drain current $I_{ds}$ and a parameter $S_{11}$ of the pulse doped structure FET.
Figure 3:
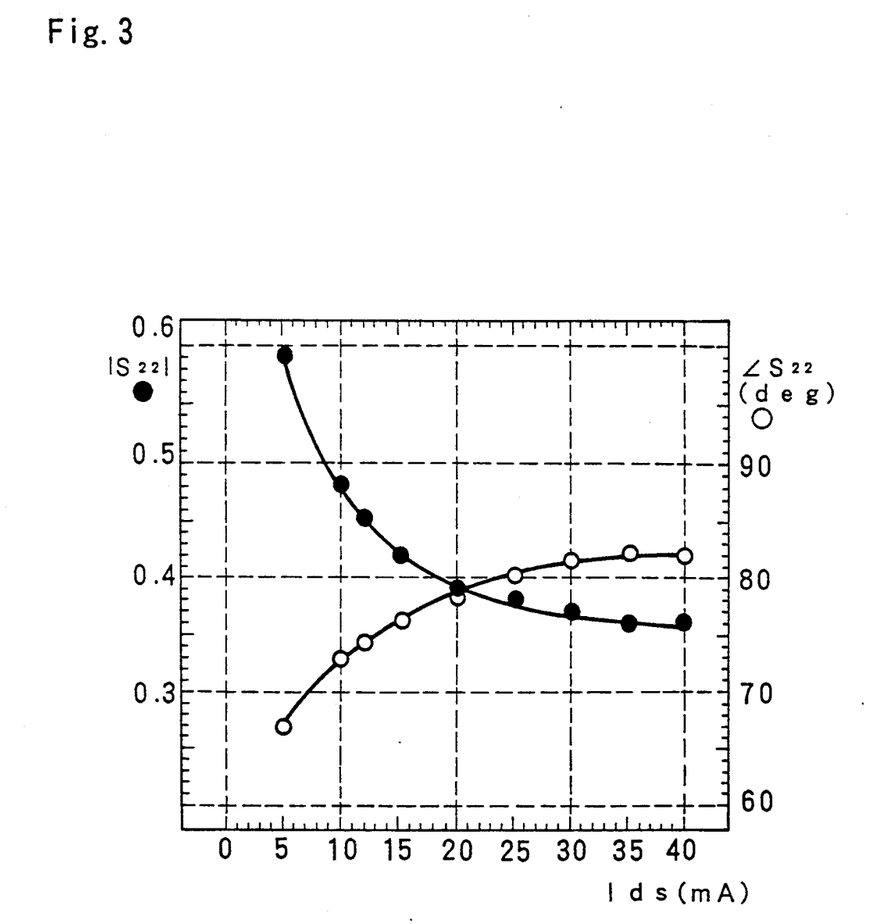
FIG. 3 is a graph showing the relationship between the drain current $I_{ds}$ and a parameter $S_{22}$ of the pulse doped structure FET.

The multistage amplifier of this embodiment employs a GaAs MESFET having a pulse doped structure. In the pulse doped structure, a pulse doped GaAs layer in which carriers are trapped is applied to an active layer of the MESFET. The drain current dependency of an optimal signal source reflection coefficient $\Gamma_{opt}$ and S parameters of the pulse doped structure FET is shown in FIGS. 1, 2, and 3. The characteristics shown in FIGS. 1 to 3 are measurement results of a pulse doped FET having a gate length of 0.3 μm, and a gate width of 280 μm.

FIG. 1 is a graph showing the relationship between a drain current $I_{ds}$ (abscissa) and an absolute value $|\Gamma_{opt}|$ (ordinate of $\Gamma_{opt}$ of the pulse doped FET, and the relationship between the drain current $I_{ds}$ and a phase angle $\angle\Gamma_{opt}$ [deg] (ordinate) of $\Gamma_{opt}$. In FIG. 1, black dots represent $|\Gamma_{opt}|$, and white dots represent $\angle\Gamma_{opt}$. FIG. 2 is a graph showing the relationship between the drain current $I_{ds}$ (abscissa), and an absolute value $|S_{11}|$ (ordinate) of a parameter $S_{11}$ of the pulse doped FET, and the relationship between the drain current $I_{ds}$ and a phase angle $\angle S_{11}$ [deg] (ordinate) of $S_{11}$. In FIG. 2, black dots represent $|S_{11}|$, and white dots represent $\angle S_{11}$. FIG. 3 is a graph showing the relationship between the drain current $I_{ds}$ (abscissa) and an absolute value $|S_{22}|$ (ordinate) of a parameter $S_{22}$ of the pulse doped FET, and the relationship between the drain current $I_{ds}$ and a phase angle $\angle S_{22}$ [deg] (ordinate) of $S_{22}$. In FIG. 3, black dots represent $|S_{22}|$, and white dots represent $\angle S_{22}$.

Figure 4:
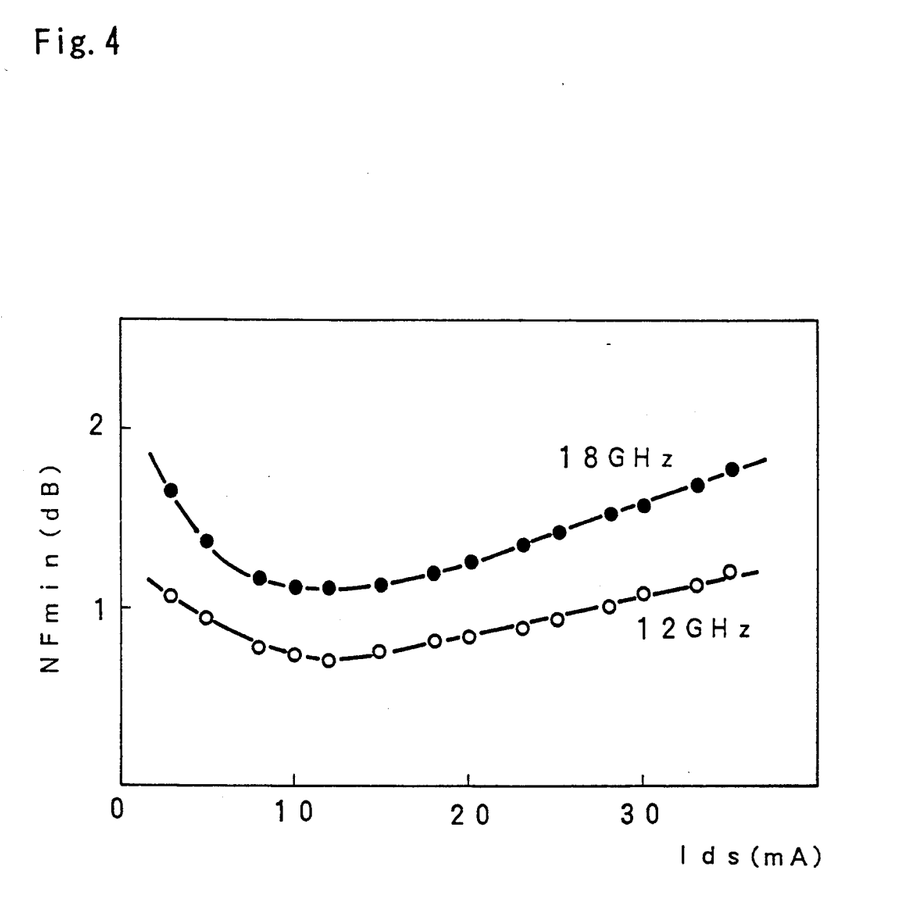
FIG. 4 is a graph showing the relationship between the drain current $I_{ds}$ and a noise factor $NF_{min}$ of the pulse doped structure FET.

The drain current dependency of an NF of this pulse doped FET is shown in FIG. 4. In FIG. 4, the drain current $I_{ds}$ [mA] is plotted along the abscissa, and a noise factor $NF_{min}$ [dB] is plotted along the ordinate. Black dots represent characteristics when the frequency is 18 [GHz], and white dots represent characteristics when the frequency is 12 [GHz]. As can be understood from FIG. 4, the NF of the FET is minimum when the drain current $I_{ds}$ is about 12 mA regardless of the frequency. For this reason, in a conventional amplifier, the operation current value of each stage of the multistage amplifier is set at 12 mA. However, as can be understood from FIGS. 1 to 3, $\Gamma_{opt}$ and the parameters $S_{11}$ and $S_{22}$ when the drain current is about 12 mA are largely changed when the drain current $I_{ds}$ is changed slightly.

As described above, when the threshold value voltage of the FET is changed due to manufacturing variations of FETs, the drain current $I_{ds}$ is changed accordingly. Therefore, a bias current is varied. For this reason, $\Gamma_{opt}$ and the parameters $S_{11}$ and $S_{22}$ are largely varied due to the variation in bias current. Thus, paying attention to the fact that the influence of the change in drain current $I_{ds}$ on $\Gamma_{opt}$ and the parameters $S_{11}$ and $S_{22}$ is small when the drain current $I_{ds}$ is about 30 mA, the operation current value of the amplifier is set at about 30 mA. When the bias point of the amplifier is set in this manner, even when the drain current $I_{ds}$ is changed by about ±10%, $\Gamma_{opt}$ and the parameters $S_{11}$ and $S_{22}$ are almost not changed. More specifically, even when the threshold value voltage is varied more or less, the NF and the I/O impedance are almost not influenced by the change in threshold value voltage.

When the drain current $I_{ds}$ is set at about 30 mA, the NF becomes slightly larger than its minimum value. However, the NF of the pulse doped FET has a very small drain current dependency. For this reason, operation current values of FETs used in first- and final-stage amplifiers are preferably set at a bias point which is less influenced by manufacturing variations, so that an average value of variations in NF can be decreased as a whole, and I/O characteristics can be stabilized. As a result, a total manufacturing yield can be improved.

Figure 6:
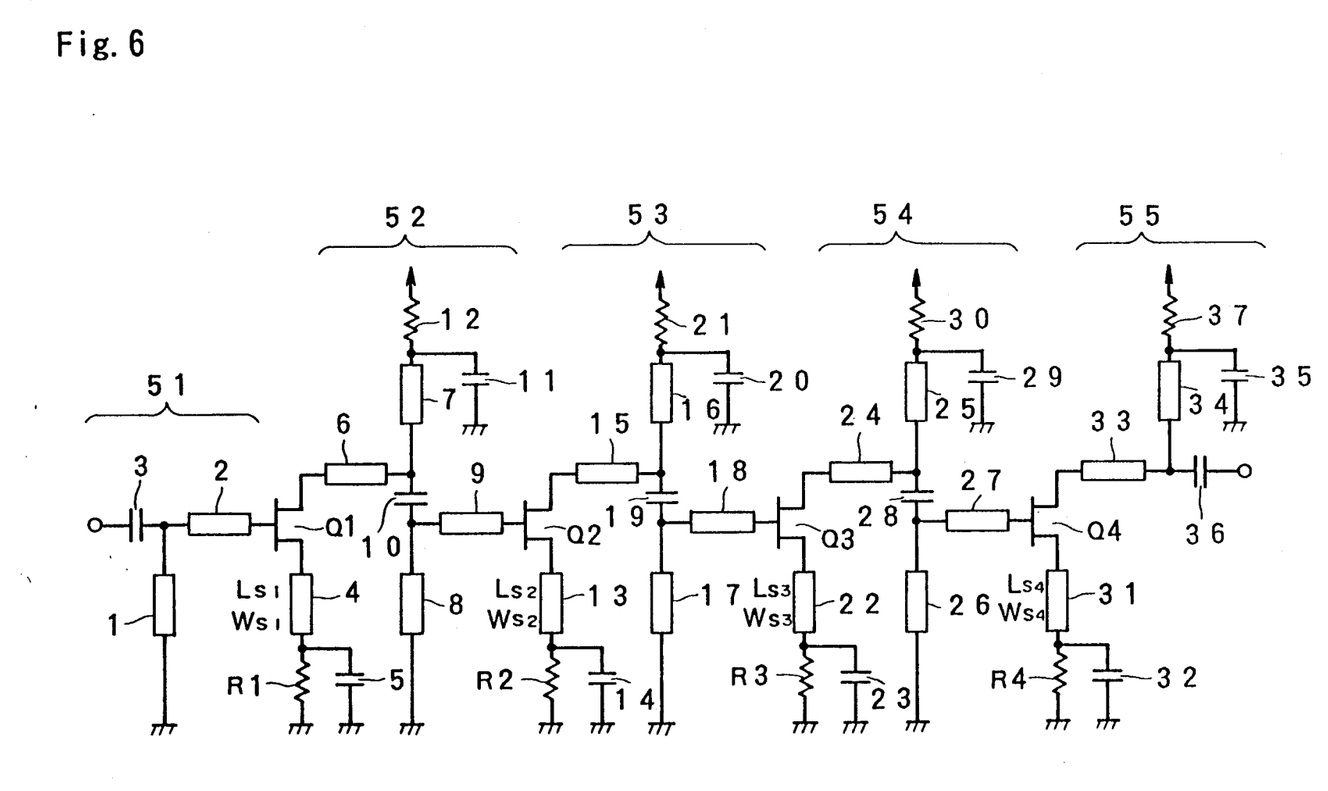
FIG. 6 is a circuit diagram showing a low-noise multistage amplifier having a four-stage structure according to an embodiment of the present invention.

FIG. 6 is a circuit diagram showing an embodiment of a low-noise four-stage amplifier designed according to the concept of the present invention. Operation current values of first- and final-stage amplifiers are set to be a value which is less influenced by $\Gamma_{opt}$ and S parameters.

As described above, the low-noise multistage amplifier employs GaAs MESFETs Q1 to Q4 having the pulse doped structure. An input matching network 51 comprising microstrip lines 1 and 2, and a capacitor 3 is arranged at the input side of a first-stage amplifier comprising the FET Q1. The source of the FET Q1 is connected in series with a microstrip line 4 and a resistor R1, and a capacitor 5 is connected in parallel with the resistor R1. An inter-stage matching network 52 comprising microstrip lines 6 to 9, capacitors 10 and 11, and a resistor 12 is arranged at the input side of a second-stage amplifier comprising the FET Q2. The source of the FET Q2 is connected in series with a microstrip line 13 and a resistor R2, and a capacitor 14 is connected in parallel with the resistor R2.

An inter-stage matching network 53 comprising microstrip lines 15 to 18, capacitors 19 and 20, and a resistor 21 is arranged at the input side of a third-stage amplifier comprising the FET Q3. The source of the FET Q3 is connected in series with a microstrip line 22 and a resistor R3, and a capacitor 23 is connected in parallel with the resistor R3. An inter-stage matching network 54 comprising microstrip lines 24 to 27, capacitors 28 and 29, and a resistor 30 is arranged at the input side of a final-stage amplifier comprising the FET Q4. The source of the FET Q4 is connected in series with a microstrip line 31, and a resistor R4, and a capacitor 32 is connected in parallel with the resistor R4. Furthermore, an output matching network 55 comprising microstrip lines 33 and 34, capacitors 35 and 36, and a resistor 37 is arranged at the output side of the final-stage amplifier.

Figure 5:
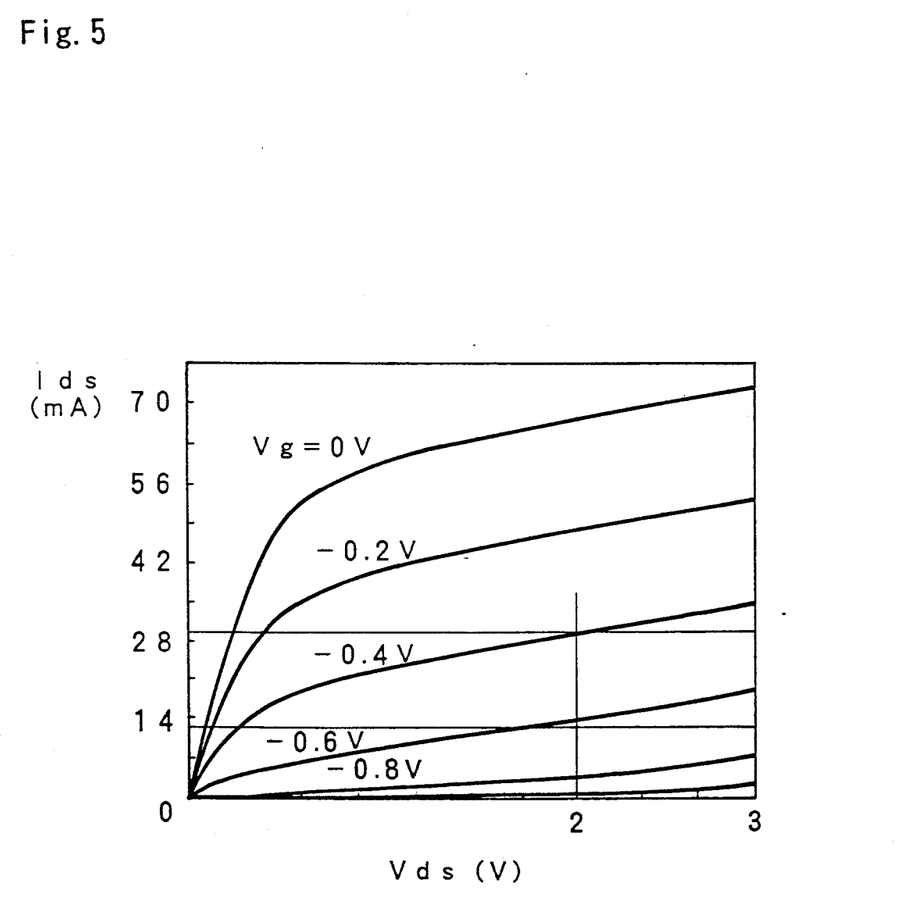
FIG. 5 is a graph showing the relationship between a drain voltage $V_{ds}$ and the drain current $I_{ds}$ of the pulse doped structure FET.

In the multistage amplifier with the above arrangement, the operation current values of the FETs Q1 and Q4 constituting the first- and final-stage amplifiers are set at 30 mA, and the operation current values of the FETs Q2 and Q3 constituting the second-and third-stage amplifiers are set at 12 mA. For this purpose, the resistances of the resistors R1 to R4 connected in series with the sources of the FETs Q1 to Q4 are set as follows. More specifically, FIG. 5 shows the relationship between a drain voltage $V_{ds}$ and the drain current $I_{ds}$ of the pulse doped FET having a gate length of 0.3 μm, and a gate width of 280 μm used in this multistage amplifier. In FIG. 5, the drain voltage $V_{ds}$ [V] is plotted along the abscissa, and the current $I_{ds}$ [mA] is plotted along the ordinate. The relationship between these current and voltage is expressed to have a gate voltage $V_g$ having a step of −0.2 V as a parameter.

As can be seen from FIG. 5, when the drain currents $V_{ds}$ of the FETs Q1 and Q4 are set at 2 V, the gate voltage $V_g$ can be set at −0.4 V in order to set the drain current $I_{ds}$ to be 30 mA. In order to set the gate voltage $V_g$ to be −0.4 V, the resistances of the resistors R1 and R4 can be set at about 13 Ω (0.4 V÷30 mA). Similarly, as can be seen from FIG. 5, when the drain voltages of the FETs Q2 and Q3 are set at 2 V, the gate voltage $V_g$ can be set at about −0.6 V in order to set the drain current $I_{ds}$ to be 12 mA. In order to set the gate voltage $V_g$ to be −0.6 V, the resistances of the resistors R2 and R3 can be set at about 50 Ω (0.6 V÷12 mA).

In this manner, in a low-noise amplifier having a multistage arrangement using pulse doped FETs each having a gate length of 0.2 to 0.5 μm and a gate width of 280 μm, the operation current values of the FETs constituting the first- and final-stage amplifiers are set at about 30 mA, and the operation current values of the FETs constituting the intermediate-stage amplifiers are set at about 12 mA, thus obtaining an amplifier having a stable NF and I/O impedance. If there is a margin for a consumption current, the operation current values of intermediate-stage amplifiers, e.g., the amplifiers using the FETs Q2 and Q3 in the above embodiment, can also be set at 30 mA. That is, the operation current values of the amplifiers in all the stages can be set at about 30 mA. In this case, a circuit arrangement which is resistant against manufacturing variations of FETs can be obtained, and a low-noise amplifier having more stable characteristics can be provided.

The above description is associated mainly with operation currents (DC components) of FETs. An improvement of I/O characteristics paying attention to AC components will be explained below.

In order to attain low-noise characteristics of an amplifier, it is effective to shorten the gate length of an FET to be used. An FET having a short gate length has a small stabilization index K.

Figure 7:
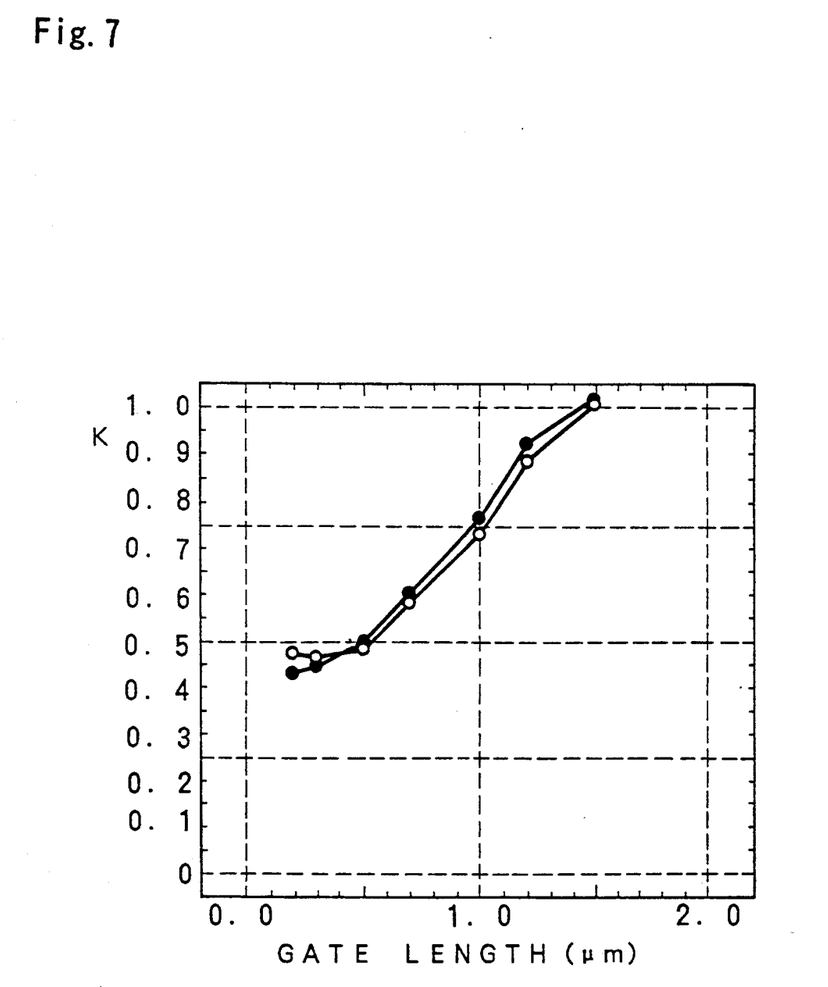
FIG. 7 is a graph showing the relationship between the gate length and a stabilization index K of the pulse doped structure FET.

FIG. 7 is a graph showing measurement results of the relationship between the gate length and the stabilization index K of a pulse doped structure FET having a gate width of 280 μm. In FIG. 7, the gate length [μm] is plotted along the abscissa, and the stabilization index K is plotted along the ordinate. An FET having a stabilization index K of 1 or more (K≧1) is unconditionally stabilized. However, in an FET having a stabilization index K of less than 1 (K<1), since unstable regions are present on input and output impedance planes, an input and an output cannot be simultaneously matched.

In general, a signal source reflection coefficient $\Gamma_{opt}$ for minimizing the NF of an FET, and a complex conjugate $S_{11}*$ of an input reflection coefficient $S_{11}$ for maximizing the gain of the amplifier (attaining input matching) do not coincide with each other. Therefore, when the NF is to be minimized, input matching is considerably impaired. On the contrary, when the input matching is to be attained, the NF is degraded. For this reason, as is well known, a stub is connected to the source of the FET, and a load of the FET is appropriately selected, so that $\Gamma_{opt}$ and $S_{11}*$ coincide with each other.

Figure 8:
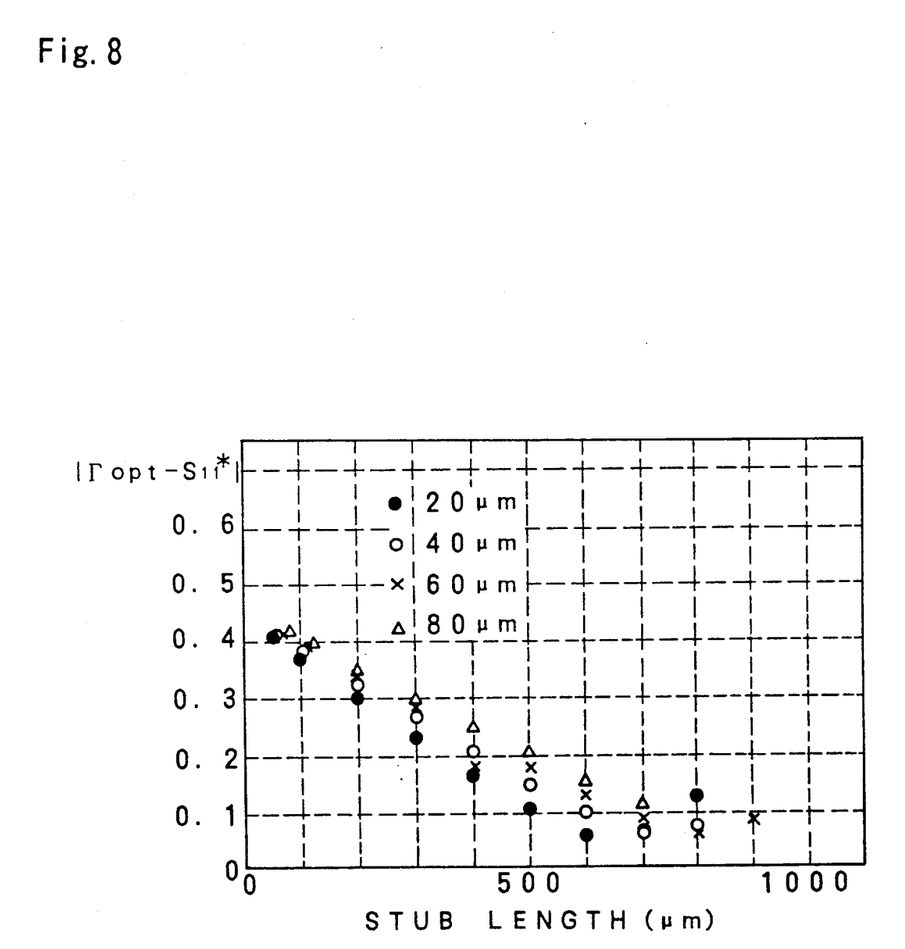
FIG. 8 is a graph showing the relationship between the gate length and a distance between $\Gamma_{opt}$ and $S_{11}*$ of the pulse doped structure FET.

FIG. 8 is a graph showing the relationship among $\Gamma_{opt}$, $S_{11}*$, and the length of the source stub. The graph of FIG. 8 shows simulation results of the relationship between a distance between $\Gamma_{opt}$ and $S_{11}*$ on the Smith chart, and the length of the source stub for a pulse doped structure FET having a gate length of 0.3 μm, and a gate width of 280 μm. In FIG. 8, the stub length [μm] is plotted along the abscissa, and a distance $|\Gamma_{opt}-S_{11}*|$ is plotted along the ordinate. Black dots represent characteristics when a stub having a stub width of 20 μm is connected, white dots represent characteristics when a stub having a stub width of 40 μm is connected, cross marks represent characteristics when a stub having a stub width of 60 μm is connected, and triangular marks represent characteristics when a stub having a stub width of 80 μm is connected.

As can be understood from FIG. 8, when a stub having a predetermined length is connected to the source of the FET, $\Gamma_{opt}$ and $S_{11}*$ can become closer to each other. Furthermore, when a load impedance of the FET is set to be a predetermined value, $\Gamma_{opt}$ and $S_{11}*$ can be caused to coincide with each other.

Figure 9:
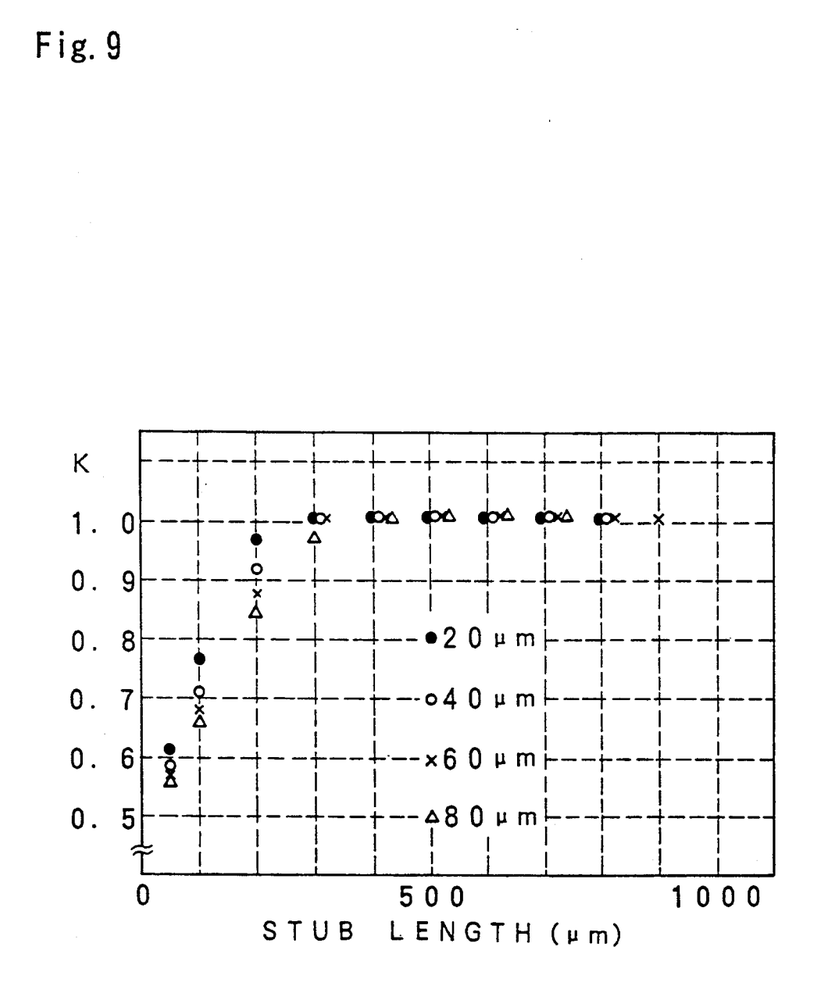
FIG. 9 is a graph showing the relationship between the gate length and the stabilization index K of the pulse doped structure FET.

FIG. 9 is a graph showing simulation results of the relationship between the source stub length and the stabilization index K. This simulation was conducted using a pulse doped structure FET having a gate length of 0.3 μm and a gate width of 280 μm like in the simulation shown in FIG. 8. In FIG. 9, the stub length [μm] is plotted along the abscissa, and the stabilization index K is plotted along the ordinate. Like in FIG. 8, black dots represent characteristics when a stub having a stub width of 20 μm is connected, white dots represent characteristics when a stub having a stub width of 40 μm is connected, cross marks represent characteristics when a stub having a stub width of 60 μm is connected, and triangular marks represent characteristics when a stub having a stub width of 80 μm is connected.

As can be understood from FIG. 9, the stabilization index K of the FET almost does not depend on the source stub width, and the stabilization index becomes almost 1 when the stub length is about 300 μm.

Figure 10:
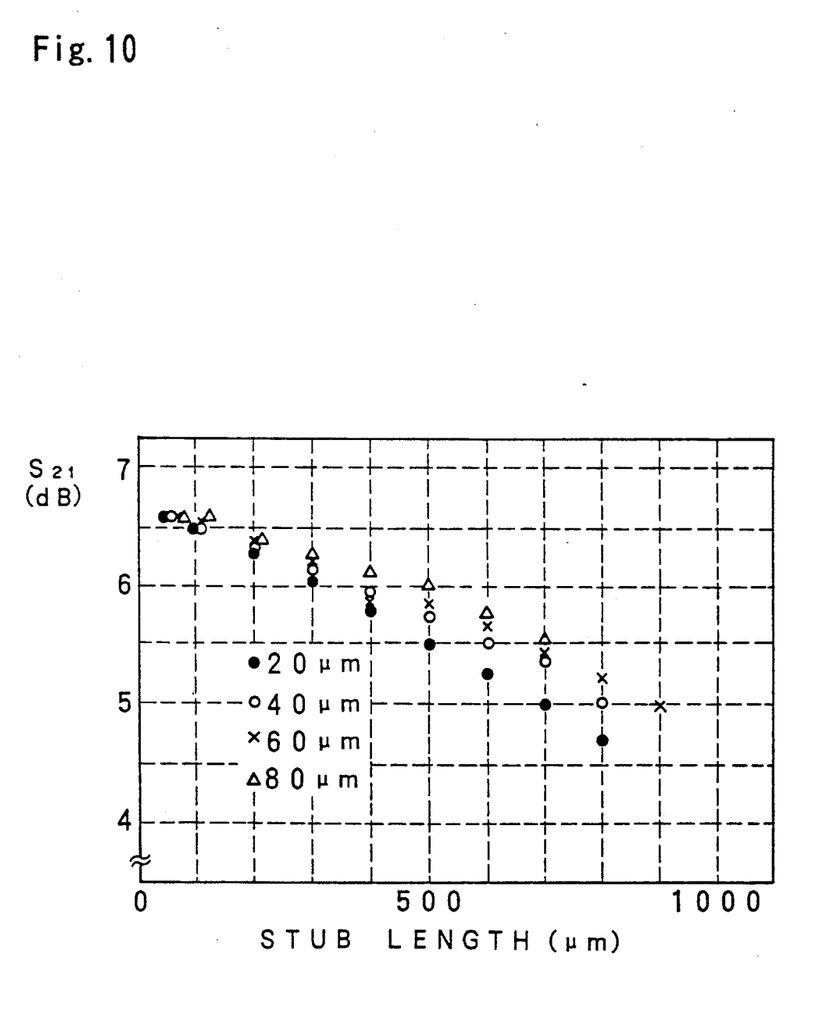
FIG. 10 is a graph showing the relationship between the gate length and a parameter $S_{21}$ of the pulse doped structure FET.

FIG. 10 shows simulation results of the relationship between the source stub length and the gain of the FET. The simulation was conducted using a pulse doped structure FET having the same gate length and gate width as in FIGS. 8 and 9. In FIG. 10, the source stub length [μm] is plotted along the abscissa, and $S_{21}$ [dB] is plotted along the ordinate. Like in FIGS. 8 and 9, black dots represent characteristics when a stub having a stub width of 20 μm is connected, white dots represent characteristics when a stub having a stub width of 40 μm is connected, cross marks represent characteristics when a stub having a stub width of 60 μm is connected, and triangular marks represent characteristics when a stub having a stub width of 80 μm is connected. As can be understood from FIG. 10, as the source stub length is increased, a feedback amount is increased, and the gain is decreased.

From FIGS. 7 to 10, the following facts are found.

①  From FIG. 7, in order to realize low-noise characteristics of an amplifier, the FET preferably has a short gate length. However, when the gate length is decreased, the stabilization index K is undesirably decreased.

②  From FIG. 8, when the length of the stub to be connected to the source of the FET is increased, a distance between the optimal signal source reflection coefficient $\Gamma_{opt}$ and the complex conjugate $S_{11}*$ of the input reflection coefficient $S_{11}$ can be reduced, and $\Gamma_{opt}$ and $S_{11}*$ can be caused to coincide with each other upon combination with a load impedance.

(3) From FIG. 9, when the source stub length is increased, the stabilization index K becomes 1, and the amplifier can be stabilized.

(4) From FIG. 10, when the source stub length is increased, the gain of the amplifier is decreased.

As can be seen from the above description, when the source stub length is increased, the feedback amount is increased, and the amplifier can be stabilized against manufacturing variations of FETs, thus increasing the manufacturing yield. However, the gain of the amplifier is decreased.

For this reason, in this embodiment, amplification characteristics of the respective stages are optimized by means of source stub lengths in accordance with roles of the respective stages of the multistage amplifier. More specifically, a source stub which is long enough to yield a stabilization index K of 1 or more is connected to the FET of the amplifier of each stage. In the first-stage amplifier which largely influences the NF of the overall amplifier, and determines an input impedance, and in the final-stage amplifier which determines an output impedance, relatively long source stubs are used to eliminate the influence of manufacturing variations of FETs, and in the intermediate-stage amplifiers, relatively short source stubs are used so as to obtain a high gain as much as possible.

The source stub will be described in detail below with reference to FIG. 6 again. Each of pulse doped structure FETs Q1 to Q4 in this amplifier has a small gate length of 0.5 μm or less, and stubs 4, 13, 22, and 31 comprising microstrip lines are connected to the sources of the FETs Q1 to Q4. Source stub lengths Ls1 and Ls4 of the stubs 4 and 31 in the first- and final-stage amplifiers are set to be 700 μm, and their stub widths Ws1 and Ws4 are set to be 40 μm. Source stub lengths Ls2 and Ls3 of the stubs 13 and 22 in the second- and third-stage amplifiers are set to be 400 μm, and their stub widths Ws2 and Ws3 are set to be 40 μm.

An input matching network 51 comprising microstrip lines 1 and 2, and a capacitor 3 is connected to the first-stage amplifier. The input matching network 51 and the stub 4 can cause an external impedance to match the signal source reflection coefficient $\Gamma_{opt}$, and the influence of manufacturing variations of FETs on the characteristics of the amplifier can be eliminated. An inter-stage matching network 52 comprising microstrip lines 6 to 9, and a capacitor 10 is connected to the second-stage amplifier. The matching network 52 and the stub 13 can cause $\Gamma_{opt}$ of the first-stage amplifier to coincide with $S_{11}^*$.

An inter-stage matching network 53 comprising microstrip lines 15 to 18, and a capacitor 19 is connected to the third-stage amplifier. An inter-stage matching network 54 comprising microstrip lines 24 to 27, and a capacitor 28 is connected to the fourth-stage amplifier. The matching network 53 and the stub 22 convert $S_{22}$ of the second-stage amplifier into $S_{11}$ of the third-stage amplifier, and the matching network 54 and the stub 31 convert $S_{22}$ of the third-stage amplifier $S_{22}$ into $S_{11}$ of the fourth-stage amplifier. For this reason, the gain of the amplifier can be maximized.

An output matching network 55 comprising microstrip lines 33 and 34, and a capacitor 36 is also connected to the final-stage amplifier. The matching network 55 and the stub 31 can eliminate the influence of manufacturing variations of FETs on the output characteristics of the amplifier.

As can be understood from FIG. 9, when the source stub length is set to be 400 μm, the stabilization index K can become almost 1 on an average with respect to manufacturing variations of FETs, but is in a dangerous state. Therefore, when the source stub lengths of the first- and final-stage amplifiers are set to be 700 μm, the amplifier can be stabilized against variations in $\Gamma_{opt}$ and S parameters although the gain is rather sacrificed, and the total yield can be increased.

The present invention is not limited to the above embodiment. For example, a three-stage amplifier using FETs each having a small gate length of 0.5 μm or less is designed as follows. More specifically, a microstrip line having a width of 20 to 80 μm, and a length of 600 to 800 μm is arranged in the source-ground path of the FET of the first-stage amplifier, and an input matching network is designed to minimize the NF. A microstrip line having a width of 20 to 80 μm, and a length of 300 to 500 μm is arranged in the source-ground path of the FET of the second-stage amplifier, and an inter-stage matching network is designed to cause $\Gamma_{opt}$ of the first-stage amplifier including the microstrip line in the source-ground path to coincide with $S_{11}^*$. A microstrip line having a width of 20 to 80 μm, and a length of 600 to 800 μm is arranged in the source-ground path of the FET of the final-stage amplifier, and an inter-stage matching network and an output matching network are designed to maximize a gain.

As for a multistage amplifier including four stages or more, microstrip lines each having a width of 20 to 80 μm, and a length of 300 to 500 μm are connected in the source-ground paths of the FETs of amplifiers in the third and subsequent stages excluding the final-stage amplifier, and inter-stage matching networks are designated to maximize a gain.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

What is claimed is:

1. A low-noise multistage amplifier constituted by connecting a plurality of stages of amplifiers each comprising an FET, wherein source stubs each of which is long enough to yield a stabilization index K of not less than 1 are connected to source-ground paths of the FETs used in the amplifiers of the respective stages, the source stubs of the first- and final-stage amplifiers are longer than the source stubs of intermediate-stage amplifiers, an input matching network connected to the first-stage amplifier minimizes a noise factor, an inter-stage matching network between the intermediate-stage amplifier in the second stage and the first-stage amplifier causes an optimal signal source reflection coefficient $\Gamma_{opt}$ and a complex conjugate $S_{11}^*$ of a parameter $S_{11}$ of the FET in the first stage to coincide with each other, and inter-stage matching networks connected to the amplifiers after the intermediate-stage amplifier in the second stage, and an output matching network connected to the final-stage amplifier maximize a gain.

2. An amplifier according to claim 1, wherein the FET comprises a pulse doped FET.

3. An amplifier according to claim 2, wherein the pulse doped FET has a gate length of 0.2 to 0.5 μm, and a gate width of about 280 μm, and lengths of the source stubs of the first- and final-stage amplifiers are 600 to 800 μm, and lengths of the source stubs of the intermediate-stage amplifiers are 300 to 500 μm.

4. An amplifier according to claim 2, wherein lengths of the source stubs of the first- and final-stage amplifiers are 600 to 800 microns, and lengths of the source stubs of the intermediate-stage amplifiers are 300 to 500 microns.

* * * * *